(12) United States Patent  
Moore

(10) Patent No.: US 6,818,608 B2  
(45) Date of Patent: Nov. 16, 2004

(54) CURED POLYMERS DISSOLVING COMPOSITIONS

(76) Inventor: John C. Moore, 420 Recht St., Hollister, CA (US) 95023

( * ) Notice: Subject to any disclaimer, the term of this patent is extended or adjusted under 35 U.S.C. 154(b) by 396 days.

(21) Appl. No.: 10/061,556

(22) Filed: Feb. 1, 2002

(65) Prior Publication Data

US 2003/0148904 A1 Aug. 7, 2003

(51) Int. Cl.$^7$ ............................ C11D 3/37; C11D 3/395; C11D 17/00
(52) U.S. Cl. ................ 510/321; 510/224; 510/303; 510/374; 510/445; 510/499
(58) Field of Search ................................ 510/321, 445, 510/224, 303, 499, 374

(56) References Cited

U.S. PATENT DOCUMENTS

| | | | | |
|---|---|---|---|---|
| 3,673,099 A | * | 6/1972 | Corby et al. | ................. 510/206 |
| 5,728,179 A | | 3/1998 | Gehling et al. | |
| 5,798,323 A | * | 8/1998 | Honda et al. | ................ 510/176 |
| 6,652,665 B1 | * | 11/2003 | Sachdev et al. | .............. 134/26 |

* cited by examiner

Primary Examiner—Gregory Webb
(74) Attorney, Agent, or Firm—Arthur J. Plantamura

(57) ABSTRACT

A cured resin dissolving composition comprising an alkyl ammonium fluoride dissolved in a wide variety of solvents and co-solvents with a soluble amine and surfactant. The composition is ionized to release fluoride which penetrates and reacts with the cured resin causing bond cleavage, breakdown, and dissolution of polymeric structure. The solvent system may be composed of hydrophilic solvents such as amides, ketones, alcohols, esters, and ethers, as well as hydrophobic families such as alkanes, alkenes, halogenated hydrocarbons, and aromatic hydrocarbons of varying carbon chain length and molecular weight. The rate of reactivity of polymer breakdown is concentration dependent upon ionized fluoride, stimulated by solution polarity and upon the amine triggered release from the organo-fluoirde. This rate is determined to be optimum in hydrophilic solvent systems with an amine. The product may be used in manufacturing to remove unwanted cured resins and their residues. Using such a hydrophilic solvent system, the formulation can be easily rinsed with water, an alcohol, or another hydrophilic rinse. When used in a hydrophobic system, rinsing is achieved with a surfactanated pre-rinse, alcohol, or another compatible solvent. By choosing between the philic and phobic formulations, selectivity towards silicone polymer may be exercised over the presence of other polymers. The formulations are safe for a wide range of metals allowing broad use in manufacturing for a wide range of applications in various industries. Hydrophilic formulations may also be used to breakdown and remove cured polymers other than silicones which include acrylic, epoxy, and novolak systems. In such cases, exposure times and conditions will vary depending upon the extent of curing. The invention has application in a wide range of industries where removal of cured resin is desired either in processing parts or for re-working. Examples of electronic industry applications include removing silicone conformal coatings, adhesives, potting compounds; applications in aerospace include removing sealant fillets during etching and machining of jet engine parts, dissolving sealant and residue from acrylic surfaces.

12 Claims, 4 Drawing Sheets

CURED POLYMERS DISSOLVING COMPOSITIONS

The invention relates to chemical compositions that possess the capability of sufficiently dissolving a variety of cured, i.e. substantially crosslinked, difficult to dissolve polymers, such as those containing the silicon oxide backbone, to an extent that the dissolved resin is readily rinsed away.

BACKGROUND OF THE INVENTION

The effective removal of Silicone and other various cured polymeric materials from hard substrate surfaces has long been a serious problem particularly in the electronic components manufacturing and the aerospace industries. In the electronics industry the difficulty arises, for example, relative to Silicone-based polymers used as conformal coatings, potting compounds on circuit boards, insulating materials, high thermal and process exposed resists and coatings in wafer processing. In the aerospace field, the problem is faced relative to Silicone-based protective coatings applied during metal machining, wire insulation, sealing of fuselage at fixture points, etc. Additionally, a problem may be confronted in the construction industry relative to Silicone waterproofing of rock and masonry, glass edge bead, insulation and the like. It is thus apparent that a need exists for a suitable composition that will easily and effectively dissolve a variety of cured Silicone polymeric substances which heretofore have presented a persistent problem in being effectively dissolved and easily washed away with water.

SUMMARY OF INVENTION

It has now been discovered, according to the invention, that a composition comprising a blend of chemistries, which will revert, i.e. breakdown, and dissolve fully crosslinked (cured) Silicone polymers can be prepared. Such polymers include various Silicone rubbers consisting primarily of crosslinked polysiloxane monomers and fillers to include RTV (room temperature vulcanizing), HTV (high-temperature vulcanizing), moulding, sealant, surface coating, and other related compounds containing the $[—Si—O—]_n$ straight chain backbone. When the crosslinked Silicone is exposed to the composition of the invention, the polymer will begin to breakdown, allowing the residue to be easily rinsed away. Applications and use of compositions of the invention include the removal of silicone encapsulation in electronics, sealants in aircraft and other uses involving situations where the elimination of insoluble crosslinked (cured) Silicone polymer is desired. Opportunities exist to use the invention in situations where selective removal is needed of a Silicone polymer in the presence of other organic materials. The choice between a hydrophilic or hydrophobic version of the invention offers a valuable tool when material selectivity is important. The removal rates to effect a thorough elimination, i.e. dissolution and washing away of any given polymeric substance, will vary depending upon the formulation used and the type of polymer, i.e. fillers contained, and amount, i.e. thickness present. Heat and agitation can be expected to improve the removal process.

DETAILED DESCRIPTION OF THE INVENTION

Figure 1:
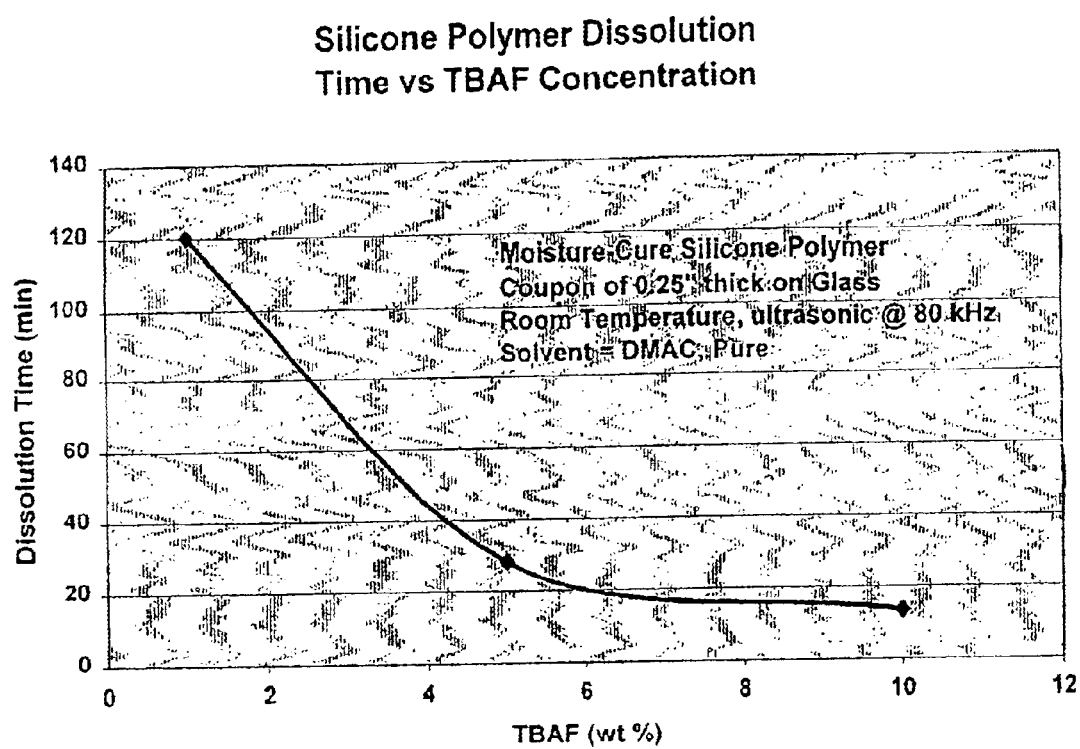
FIG. 1 indicates the performance benefit on silicone polymer dissolution with increasing TBAF concentration.

In accordance with the invention, a suitable composition for the effective dissolution of crosslinked polymeric substances is provided comprising an organo-fluorine in combination with a solvent and a soluble amine.

A preferred organo-fluorine dissolving system comprises, for example, tetrabutylammonium fluoride (TBAF) dissolved in a variety of solvents with a soluble amine, 1,8-diazabicyclo(5.4.0)undec-7-ene (DBU). The TBAF is believed to be ionized to release an organo-soluble fluoride which penetrates cured silicones and reacts with the silicon of the $[—Si—O—]_n$ polymer backbone, causing bond cleavage, breakdown, and dissolution of the polymeric structure, allowing it to be completely rinsed away.

Solvent Selectivity Options

Although the majority of this invention is composed of an organic solvent, the critical component is the presence of TBAF. In optimizing a formulation, the choice of solvent will need to maximize the affinity for the Silicone polymer (hydrophobicity) and the solubility of TBAF (hydrophilicity). The trade-off must be balanced between the hydrophobic affinity of silicone and the hydrophilic solubility preference of TBAF. Optimization occurs when a balance is reached between the two, and better yet, a synergism.

Due to the options available in the choice of solvent, selectivity can become a driving force in the formulation. Namely, this invention describes at least two preferred formulation options, one being hydrophobic and the other hydrophilic. By choosing the right formulation system, Silicone polymer may be selectively removed in the presence of other polymers having either hydrophobic or hydrophilic character. Attention must also be given to any reactivity that may exist between the solvent and TBAF. To begin this review, it may be prudent to have a short discussion on the nature of Silicone polymers.

Chemical-Physical Nature of Silicone

Silicone polymers have a chemical-physical property of being non-polar or hydrophobic. They exhibit relatively low surface energy similar to hydrocarbons (i.e. <25 Joules for polydimethyl siloxanes vs 40 Joules for polyvinylchloride), high contact angle as measured against water (i.e. >100 degrees for Silicone on glass vs 0 degrees for clean glass), and a high resistance to hydrophilic chemicals measured as % increase in volume, or swelling (i.e. <25% for acetone and alcohol vs >150% for alkanes and aromatics). The hydrophobic quality of Silicones is based upon the extension of the methyl groups from the Si atoms strung along the $[—Si—O—]_n$ backbone. Most Silicone polymers are straight chain moieties with the $[—Si—O—]_n$ backbone embedded between two layers of methyl groups. Therefore, when a Silicone polymer is present on a hard surface, one series of methyl groups attached to the $[—Si—O—]_n$ backbone is attached to the hard surface while the other extends outwards. The hydrophobicity of these methyl groups explain why primers are so important during substrate attachment. The series of methyl groups extending from the surface of the Silicone polymer to the environment produces an organic layer having hydrocarbon (i.e. straight-chain) character. Such hydrophobicity towards the environment explains the significant chemical resistance and high water repulsion.

Performance Dependence on TBAF

A critical parameter, which controls dissolution of Silicone polymer, is the presence and concentration of TBAF. Within a given solvent system, Silicone polymer dissolution increases with an increase in TBAF concentration. Data shows that concentrations of TBAF at 5% in a given solvent are observed to dissolved Silicone polymer at room temperature conditions. This performance will increase with TBAF concentration. FIG. 1 indicates the performance benefit on Silicone polymer dissolution with increasing TBAF concentration.

The data in FIG. 1 shows that for a given solvent system, increasing TBAF from a wt % value of 1 to 5 will increase the dissolution rate by a factor of 4. An increase of TBAF from a wt % of 5 to 10 is shown to further improve performance by a factor of 2. Therefore, by increasing TBAF from a wt % of 1 to 10, Silicone polymer dissolution performance is expected to increase by a factor of 10 (1 order), as shown in FIG. 1 with a reduction in dissolution time from 120 min to 13 min.

TBAF Solubility

The invention describes various formulation possibilities involving TBAF dissolution into solvents. The formulations may be composed of hydrophilic solvents such as amides, ketones, or alcohols, as well as hydrophobic families such as alkanes, alkenes, and aromatic hydrocarbons of varying carbon chain length and molecular weight. In cases of limited solubility (i.e. hydrophobic solvents), TBAF may be solubilized by using a mutually soluble amine such as diethylhydroxylamine (DEHA).

Figure 2:
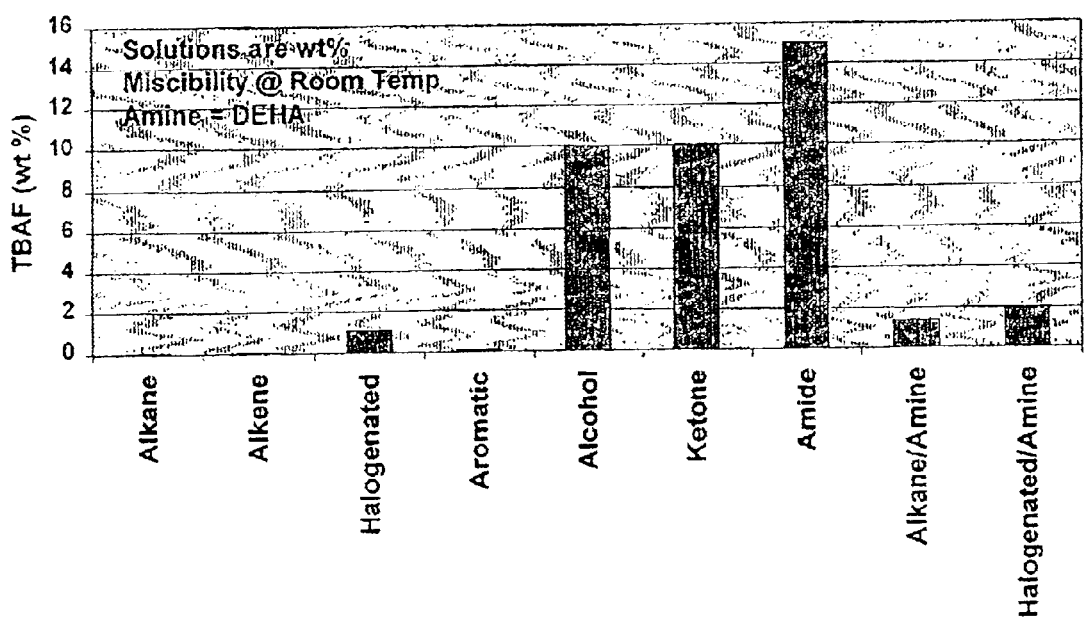
FIG. 2 indicates the solubility of TBAF in various solvents.

The data in FIG. 2 shows that TBAF has limited solubility in hydrophobic reagents with the exception of halogenated systems. Depending upon the halogenated system, such as n-octyl bromide (NOB), it will have polar character as compared to common straight chain systems due to the more electronegative halogen substituent (i.e. bromine). This increase in polar character will result in an increase in TBAF solubility. Alternatively, TBAF solubility can be increased through the addition of amine. By adding the amine, DEHA, at 10 wt % to an alkene and a halogenated hydrocarbon, the TBAF solubility is increased from a wt % of <0.1 to >1 and 1 to 2, respectively for each chemistry.

TBAF and Chemistry Balance

Silicone polymer have been shown to absorb and swell when exposed to hydrophobic solvents and will breakdown and dissolve when exposed to solvents containing the TBAF additive. Due to the interdependency in dissolution performance on solvent and TBAF concentration, a range in results are expected for different systems.

Figure 3:
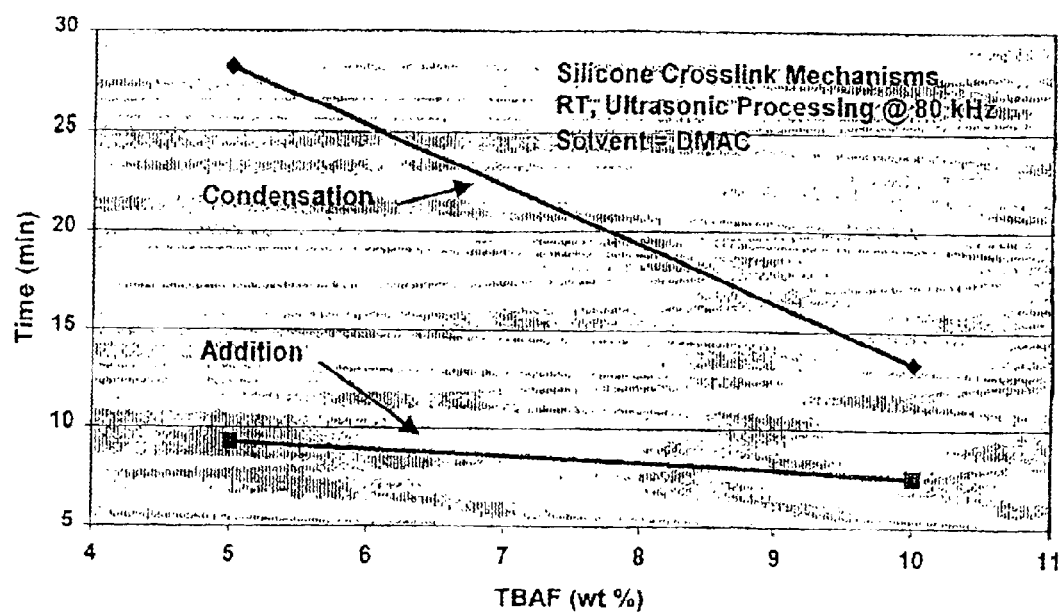
FIG. 3 indicates silicone polymer performance dependence on chemistry.

The data in FIG. 3 shows that an interdependence on chemistry and TBAF addition exists. Although all chemistries contain 1 wt % of TBAF, performance varies. The docecene and DMAC suggest dissolution performance at each end of the polarity scale. Neither shows performance benefit at less than 120 min. N-octyl bromide (NOB) indicates a benefit towards reducing dissolution by half from 120 min to near 60 min. The NOB offers hydrophobicity affinity to Silicone polymer and TBAF solubility (see FIG. 2). The polarity benefit of NOB over a straight chain hydrocarbon is expected to aid fluorine ionization in organic media. Although DMAC is expected to offer significant fluorine ionization, little or no affinity towards Silicone polymer is expected due to the strong hydrophilicity of the chemistry. A balance in the solvation of TBAF and hydrophobicity is key towards optimization of a formula.

Silicone Polymer Dissolution

Silicone (polysiloxane) monomers commonly include dimethylsiloxane and diphenylsiloxane. During the polymerization process, Silicone compounds will undergo a cross-linking reaction based upon condensation, addition, or the combination thereof, utilizing a metal catalyst and environmental conditions, which accelerate the reaction sequence. The crosslinked product commonly exists with properties of an elastomer due to the flexibility in the [—Si—O—]$_n$ straight chain backbone. The elastic properties may be modified towards a harder product by adding finely divided fillers comprised of carbon (i.e. carbon black), ceramics (i.e. amorphous silica), or metallic particulates (i.e. micronized iron or nickel).

The dissolution of Silicone polymers, which are cured by different crosslink mechanisms, is achieved by the invention. Although some variation in performance exists, Silicone polymer will breakdown and be easily rinsed by the invention. Crosslink mechanisms represented by condensation or addition are dissolved in DMAC solvent at an accelerated pace with an increase in wt % of TBAF.

Figure 4:
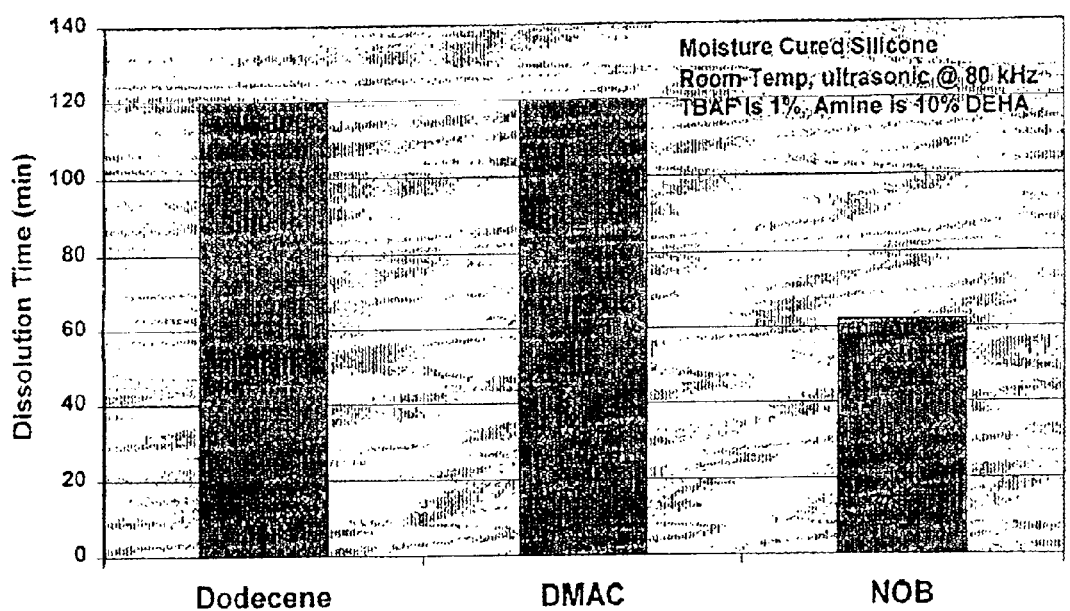
FIG. 4 indicates the dissolution of silicone polymer over concentration of TBAF on crosslink mechanism.

Using a minimum concentration of TBAF at 5 wt % in DMAC, Silicone polymerized by two different mechanisms will breakdown and dissolve at different rates. Both polymers will dissolve at an increased rate (i.e. reduced time) with the concentration of TBAF. The dissolution performance shown in FIG. 4 is carried out at room temperature and would be expected to increase with temperature according to the Arrhenius equation (i.e. rate increase by a factor of 2 with each increase in temperature by 10 degrees C.

In another test, efforts were conducted to optimize Silicone dissolution performance in different solvents. Each solvent system contained 10 wt % of TBAF. The following results in Table 1 represent a static immersion test (no agitation) at elevated temperature (60–70° C.):

TABLE 1

| Chemistry | Dissolution Time (min) |
|---|---|
| N-Methyl-2-pyrrolidone (NMP) | 55.4 |
| Gamma-Butyrolactone (GBL) | 60.0 |
| Cyclohexanone | 17.3 |
| Methyl Ethyl Ketone (MEK) | 3.5 |
| N,N-Dimethylacetamide (DMAC) | 24.5 |
| DMAC + Amine (DBU) @ 1% | 22.1 |

Dissolution rates of Silicone polymer at static conditions (no agitation) at temperatures of 60–70° C. are shown in Table 1. Dissolution was measured as complete removal.

The data presented in Table 1 is from primarily two solvent families, ketones and amides. The ketones tested span over a polar range which covers both hydrophilic and hydrophobic solvents. The best performing solvent was found to be MEK. It has good solubility for TBAF, yet maintains excellent hydrophobic affinity. On the hydrophilic side, DMAC performs much faster than the ketone counterparts, NMP and GBL. Performance improvements exist when amine, as 1,8-diazabicyclo(5.4.0)undec-7-ene (DBU), is added to DMAC. At least a 10% performance increase is made with a small dose (i.e. 1%) of DBU. Further optimization is possible with additional amine, especially when attempting to remove and dissolve a broad range of polymers.

Using these developments, two systems may be used here for selective dissolution and removal of Silicone polymers from organic substrate materials, see Table 2.

TABLE 2

| Chemistry | Target Polymer | Substrate Material |
|---|---|---|
| MEK + TBAF | Silicone | Fiberglass composite, acrylic, PVC, styrene, other hydrophile, etc. |
| DMAC + TBAF | Silicone | Polyethylene, hydrocarbon, paraffin wax, rubber, other hydrophobe, etc. |

Selective dissolution of Silicone polymer in the presence of other organic materials is referenced in Table 2 as described in more detail herein.

Using a formulation of TBAF and amine as DBU in a range of hydrophilic solvents such as ketones and amides with a co-solvent glycol ether and a nonionic surfactant, a hydrophilic product may be used in manufacturing to remove unwanted cured silicones and their residues. In turn, a hydrophobic product may be prepared by using a formulation of TBAF with amine as DEHA in a range of hydrophobic solvents such as alkanes, alkenes, aromatics, halogenated, and certain non-polar ketones such as MEK and cyclohexanone with a glycol ether co-solvent and a nonionic surfactant. Selectivity in the removal of Silicone polymer in the presence of other polymers can be exercised. Both of the Silicone polymer removal products can be rinsed with an alcohol, such as isopropyl alcohol. As an alternative, a surfactanated aqueous chemistry may be used as a pre-rinse and followed by pure water.

When the TBAF and amine as DBU are used in a hydrophilic solvent, selectively towards Silicone polymer may be exercised over the presence of other hydrophobic polymers. Examples of selectivity of such a hydrophilic formulation include the removal of crosslinked Silicone from substrates composed of polyethylene or polypropylene, hydrocarbon, rubber, and other similar hydrophobic material.

When the TBAF and amine as DEHA are used in a hydrophobic solvent, selectively towards Silicone polymer may be exercised over the presence of other hydrophilic polymers. Examples of selectivity of such a hydrophobic formulation include the removal of crosslinked Silicone from acrylic, styrene, carbonate, urethane, sulfone, or vinyl chloride polymeric systems.

Rinsing of either the hydrophilic or hydrophobic formulations requires a surfactanated aqueous pre-rinse followed by water, alcohol, or a compatible organic rinse. The formulations are safe for a wide range of metals allowing use in manufacturing for a wide range of applications in various industries. Hydrophilic formulations of TBAF and DBU may also be used to breakdown and remove other cured polymers including acrylic, epoxy, and novolak systems. Depending on the insoluble polymeric substance, the required exposure times and conditions will vary depending upon the extent of curing.

The composition of the invention may be used in a wide range of industries where difficult to remove cured resins are present such as when processing parts or for re-working. Examples of applications in electronics include removing silicone conformal coatings, adhesives, potting compounds; applications in aerospace include removing sealant fillets during etching and machining of jet engine parts, dissolving sealant and residue from acrylic surfaces, and cleaning a substrate prior to resurfacing.

The composition of the invention to work well in dissolving and removing a variety of cured polymeric materials from hard surfaces and microscopic hard-to-reach areas is particularly advantageous for use in high-tech applications that are subject to stringent quality criteria. Materials composed of silicone, novolak resin, rosin, polysulfide, polythioether, acrylics, PMMA, epoxies, and other polymers are dissolved by liquefying and then removed by flushing with an aqueous rinse.

The compositions of the invention have an unusually low viscosity and a surfactant package which allows the wetting of surfaces by contact angle reduction, penetration, and a high rate of diffusion. These physical chemical properties synergistically combine enabling superior performance beyond that exhibited individually. Tenacious organic material is penetrated, dissolved, emulsified, and suspended to prevent-redeposition, allowing easy rinsing. The low foaming characteristic of the composition of the invention allows greater efficiency for capillary action to microscopic dimensions during a variety of agitation conditions. Heat and agitation are found to improve performance appreciably.

Suitable surfactants include non-ionic alkoxylated linear alcohols such as the tradename Polytergent SL92, available from BASF Corporation. The surfactant functions to reduce surface tension and aid in the rinsing process. The surfactant preferably has a high cloud point (i.e. >60° C.) to allow for heated processing and rinsing without miscibility issues. A non-ionic environment is required for inert conditions towards dissolved metals and maximum solubility in a wide range of media, both solvent and water. Low foaming capacity allows for product use in various automated equipment. Alternative surfactants include nonyl-phenols and nonyl-ethoxylates with a HLB (hydrophilic/lipophilic balance) ranging from 7–15. Less than about 2 weight percent of the non-ionic surfactant and preferable an amount of about 0.5 to about 1 weight percent is sufficient.

The composition of the invention is intended for use at a range of temperatures. It may be sprayed, wiped or used in an immersion-based cleaning system. Agitation is not necessary, but will significantly enhance performance. A variety of agitation forms may be used, including mixing, spraying, and ultrasonic agitation at a variety of frequencies, typically $\leq 170$ kHz. The composition of the invention must be used at full strength. Dilution will reduce effectiveness or may completely render it ineffective. In the case of the hydrophobic formulations, water is incompatible and any addition of water will likely cause two layers to form, separate, and selectively leach the TBAF into the aqueous layer rendering the entire system to be useless. It is recommended that the composition be used at room temperature or with the minimum amount of heat possible to achieve the desired results. Although heat will enhance the cleaning power, excess heat may deteriorate the dissolving composition over time.

Rinsing must be matched with the formulation type. In the case of the hydrophilic formulation, compatibility with water is complete. Although simple water may used to rinse the product, rinsing with a low surfactanated emulsifier followed by pure water will improve removal of all residue. In the case of the hydrophobic formulation, water is not compatible. Aqueous rinsing requires a pre-rinse emulsifier chemistry. An emulsifier will improve rinsing via a "sheeting" effect, reduce contaminant re-deposition, and reduce water usage. In cases where water is not preferred, a compatible solvent such as alcohol (IPA) or acetone may be used.

In accordance with the invention components suitable for formulating the composition of the invention comprise, an organo-fluorine, a solvent, which may include a co-solvent, an amine, and a surfactant:

1. The organo-fluorine includes: tetrabutylammonium fluoride (TBAF).

2. Solvents include: amides such as n,n-dimethylacetamide (DMAC); ketones such as methyl ethyl ketone (MEK), cyclohexanone, acetone, n-methyl-2-pyrrolidone (NMP) and gamma-butyrolactone (GBL); alcohols such as isopropyl alcohol, butanol, and higher alcohols; ethers such as tripropyleneglycol monomethylether (TPM), dipropyleneglycol monomethylether (DPM), n-propyleneglycol propylether (PNP), and propyleneglycol monomethylether (PM), esters such as ethyl lactate; alkanes such as dodecane; alkenes such as dodecene; halogenated hydrocarbons such as n-n-propyl bromide (NPB) and octyl bromide (NOB); and aromatics such as xylene, and terpenes.

3. Co-solvents include: glycol ethers such as tripropyleneglycol monomethylether (TPM), dipropyleneglycol monomethylether (DPM), propyleneglycol n-propylether (PNP), and propyleneglycol monomethylether (PM).

4. Suitable amines include: 1,8-diazabicyclo(5.4.0)undec-7-ene (DBU), diethylhydroxylamine (DEHA), and others such as triethylenetetramine (TETA), choline hydroxide, tetramethylammonium hydroxide (TMAH), and benzyltrimethylammonium hydroxide (BTMAH).

5. Surfactants include nonionic systems that are compatible with the hydrophilic and hydrophobic formulations such as alkoxylated linear alcohols similar to the tradename Polytergent SL92, available from BASF Corporation.

Although the invention has been described in terms of particular embodiments, blends of one or more of the various additives described herein can be used, and substitutes therefor, as will be know to those skilled in the art. Thus the invention is not meant to be limited to the details described herein, but only by the scope of the appended claims.

What is claimed:

1. A composition effective for dissolving a cured polymeric resin comprising:

(a) an organo-fluorine component of the formula

   "$(CH_3CH_3CH_2CH_2)_4NF\cdot(H_2O)_3$";

(b) a soluble amine component of the formula "$C_9H_{16}N_2$ or $(C_2H_5)_2NOH$";

(c) a solvent for components a and b; and (d) wherein the proportion of "a" and "b" is between about 0.1 wt % and about 15 wt %.

2. The composition of claim 1 which includes a compatible surfactant.

3. The composition of claim 1 wherein "b" is 1,8-diazabicyclo(5.4.0)undec-7-ene (DBU).

4. The composition of claim 3 wherein "a" is tetrabutylammonium fluoride.

5. The composition of claim 1 wherein the solvent "c" is selected from methyl ethyl ketone and n,n-dimethylacetamide.

6. The composition of claim 2 wherein "b" is selected from 1,8-diazabicyclo(5.4.0)undec-7-ene (DBU) and diethylhyroxlyamine.

7. The composition of claim 1 wherein "b" is 1,8-diazabicyclo(5.4.0)undec-7-ene (DBU) and "c" is selected from n,n-dimethylacetamide and methyl ethyl ketone.

8. The composition of claim 2 wherein "b" is selected from 1,8-diazabicyclo(5.4.0)undec-7-ene (DBU) and diethylhyroxlyamine and "c" is selected from n,n-dimethylacetamide and methyl ethyl ketone.

9. A process for removing cured polymeric resin from the surface of substrates containing a layer of cured resin comprising coating said cured resin layer with the composition of claim 1, allowing sufficient lapse of time to permit the dissolution of the resin and flushing the dissolved resin from the substrate with a rinse.

10. A process for removing cured polymeric resin from the surface of substrates containing a layer of cured resin comprising coating said cured resin layer with the composition of claim 2, allowing sufficient lapse of time to permit the dissolution of the resin and flushing the dissolved resin from the substrate with a rinse.

11. A process removing cured polymeric resin from the surface of substrates containing a layer of cured resin comprising coating and said cured resin layer with a composition of claim 6, allowing sufficient lapse of time to permit the dissolution of the resin and flushing the dissolved resin from the substrate with a rinse.

12. The process of claim 9 wherein the cured resin to be removed from the substrate is a cured silicone.

* * * * *